United States Patent [19]

Canestaro et al.

[11] Patent Number: 4,728,751
[45] Date of Patent: Mar. 1, 1988

[54] FLEXIBLE ELECTRICAL CONNECTION AND METHOD OF MAKING SAME

[75] Inventors: Michael J. Canestaro, Endicott; William J. Summa, Endwell, both of N.Y.

[73] Assignee: International Business Machines Corporation, Armonk, N.Y.

[21] Appl. No.: 915,485

[22] Filed: Oct. 6, 1986

[51] Int. Cl.$^4$ .................................................. H05K 1/02
[52] U.S. Cl. ................................. 174/68.5; 361/404; 361/406; 361/408
[58] Field of Search ............... 174/68.5; 361/404, 406, 361/408

[56] References Cited

U.S. PATENT DOCUMENTS

| | | | |
|---|---|---|---|
| 3,129,280 | 4/1964 | Elarde | 174/68.5 |
| 3,248,779 | 5/1966 | Yuska et al. | 361/408 X |
| 3,487,541 | 1/1970 | Boswell | 174/68.5 X |
| 3,519,890 | 7/1970 | Ashby | 174/68.5 X |
| 4,026,011 | 5/1977 | Walton | 174/68.5 X |
| 4,026,759 | 5/1977 | McBride et al. | 156/632 |
| 4,048,438 | 9/1977 | Zimmerman | 174/68.5 |
| 4,295,184 | 10/1981 | Roberts | 174/68.5 X |
| 4,413,308 | 11/1983 | Brown | 361/398 |
| 4,448,804 | 5/1984 | Amelio et al. | 427/98 |

OTHER PUBLICATIONS

Miller, L. F., "Flexible Chip Joints", *IBM Technical Disclosure Bulletin,* vol. 11, No. 9, p. 1173, Feb. 1969.

*Primary Examiner*—R. R. Kucia
*Attorney, Agent, or Firm*—David L. Adour

[57] ABSTRACT

A flexible electrical connection, and method for making such a connection, for mounting an electronic device, such as a semiconductor chip made primarily of silicon, on an organic substrate, such as a printed circuit board made of a glass material impregnated with epoxy resin, are disclosed. The flexible electrical connection comprises a circuit line attached to the surface of the organic substrate and having a floating terminus in a relatively low adhesive area of the organic substrate where it is desired to mount the electronic device on the organic substrate. The floating terminus includes a stress relief bend, and the flexible electrical connection relieves stresses, such as thermal stresses, which may otherwise damage the physical and/or electrical connection between the electronic device and the floating terminus of the flexible electrical connection when the electronic device is mounted on the surface of the organic substrate.

2 Claims, 4 Drawing Figures ated with epoxy resin or other such material, having a thermal coefficient of expansion which is significantly different from the thermal coefficient of expansion of the silicon making up the electronic device.
FLEXIBLE ELECTRICAL CONNECTION AND METHOD OF MAKING SAME

BACKGROUND OF THE INVENTION

The present invention generally relates to mounting an electronic device directly on a substrate when there is a mismatch between the thermal properties of the material making up the electronic device and the thermal properties of the material making up the substrate. More particularly, the present invention relates to mounting an electronic device, such as a semiconductor chip made primarily of silicon, directly on an organic substrate, such as printed circuit board made primarily of glass cloth impregnated with epoxy resin or other such material.

It is often desired to mount an electronic device directly on a substrate as described above when there is a mismatch between the thermal properties of the material making up the electronic device and the thermal properties of the material making up the substrate. For example, an electronic circuit board may be constructed by soldering the leads (terminals) on electronic devices, such as semiconductor chips made primarily of silicon or semiconductor chip carriers (modules) made primarily of a ceramic material, to fixed conductive circuit lines on the surface of a printed circuit board made primarily of an organic material, such as glass cloth impregnated with epoxy resin or other such material, having a thermal coefficient of expansion which is significantly different from the thermal coefficient of expansion of the material(s) making up the electronic device. If excessive stress is applied to such an electronic circuit board, for example, due to thermal cycling during the manufacture or use of the circuit board, this may damage the solder joints between the electronic device and the circuit lines on the circuit board thereby possibly allowing the electronic device to break free from the circuit board or causing other such undesirable problems.

Certain stress relief techniques are known for use in mounting electronic devices on circuitized substrates as disclosed in U.S. Pat. Nos. 4,413,308, 4,048,438, and 4,026,759. Also, see the article by L. F. Miller, "Flexible Chip Joints", IBM Technical Disclosure Bulletin, Vol. 11, No. 9, p. 1173, February 1969. However, these known techniques are complex in requiring, for example, a hole in a printed circuit board wherein an electronic device is to be mounted as disclosed in U.S. Pat. No. 4,413,308. Also, these known techniques do not specifically address mounting an electronic device made primarily of a material(s), such as silicon, directly on an organic substrate, such as a glass cloth impregnated with epoxy resin or other such material, having a thermal coefficient of expansion which is significantly different from the thermal coefficient of expansion of the material(s) making up the electronic device.

SUMMARY OF THE INVENTION

Therefore, an object of the present invention is to provide a relatively simple stress relieving electrical connection for mounting an electronic device directly on a substrate when there is a mismatch between the thermal properties of the material(s) making up the electronic device and the material(s) making up the substrate.

Another object of the present invention is to provide a relatively simple stress relieving electrical connection for mounting an electronic device made primarily of a material, such as silicon, directly on an organic substrate, such as a glass cloth impregnated with epoxy resin or other such material, having a thermal coefficient of expansion which is significantly different from the thermal coefficient of expansion of the silicon making up the electronic device.

A further object of the present invention is to provide a method for making such stress relieving electrical connections.

These and other objects of the present invention are attained by providing flexible electrical connections as part of circuit lines on a substrate made of a material, such as glass cloth impregnated with epoxy resin, on which it is desired to mount an electronic device made of a material(s) having significantly different thermal properties, such as a semiconductor chip made primarily of silicon or a semiconductor chip carrier (module) made primarily of a ceramic material. Each flexible electrical connection comprises a terminus of one of the circuit lines having a stress relief bend floating on a relatively low adhesion area of the substrate where it is desired to connect the electronic device to the circuit lines on the substrate. Each flexible electrical connection provides relief of thermal and other such stresses which could damage or otherwise undesirably affect electrical circuit connections between the circuit line termini and leads (terminals) of the electronic device.

Such a flexible electrical connection according to the present invention may be made by processing a selected surface portion of a substrate to form a relatively low adhesive area surrounded by a relatively high adhesive area. Then, a circuit line pattern may be formed on the substrate, including circuit lines having termini with stress relief bends located in the relatively low adhesive area on the surface of the substrate so that the terminus of each of these circuit lines floats on the surface of the substrate while the remainder of the circuit line is surely fixed to the relative, high adhesive area on the surface of the substrate. These floating termini of the circuit lines having the stress relief bends form the flexible electrical connections to which leads (terminals) of an electronic device may be joined by soldering, thermal compression bonding, ultrasonic bonding, or by using other such suitable bonding techniques.

BRIEF DESCRIPTION OF THE DRAWING

Other objects and advantages of the present invention will be apparent from the following description in conjunction with the accompanying drawing, in which like reference numerals identify like elements, and in which.

DESCRIPTION OF THE PREFERRED EMBODIMENT

Figure 1:
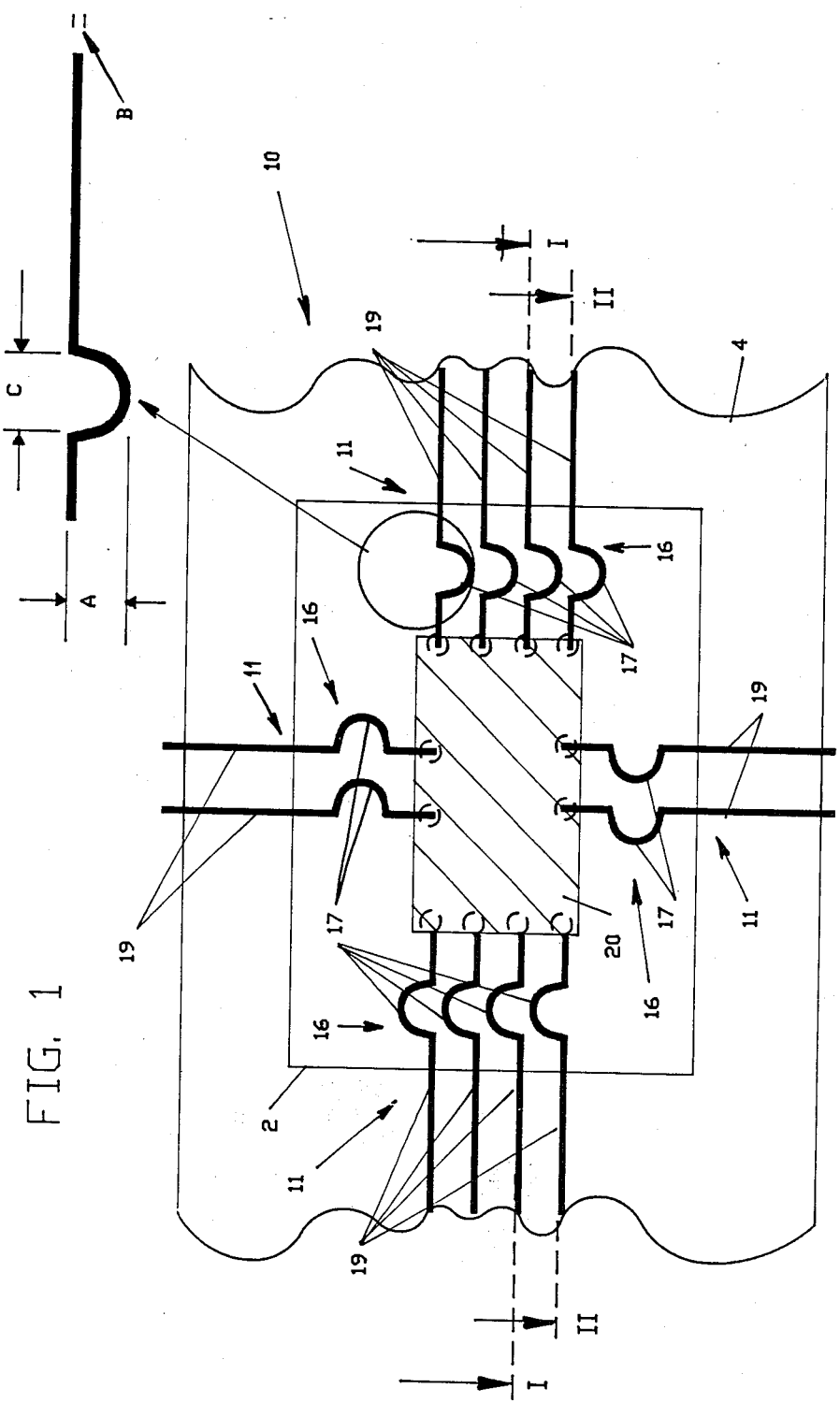
FIG. 1 is a plan view of a portion of a printed circuit board made of an organic material, such as glass cloth impregnated with epoxy resin or other such material, and having a semiconductor chip made primarily of a material such as silicon, mounted directly on the surface of the circuit board using a plurality of stress relieving flexible electrical connections according to the principles of the present invention.

Referring to FIG. 1, a plan view is shown of a portion of a printed circuit board or card 10 made primarily of glass cloth impregnated with an epoxy resin, having a plurality of circuit lines 11 each having a terminus 16 located in a relatively low adhesion area 2 of the printed circuit board 10, which provides a flexible electrical connection for mounting a semiconductor chip 20 made primarily of silicon directly on the circuit board 10 according to the principles of the present invention. The area 2 of the printed circuit board 10 is somewhat larger than the size of the chip 20 which it is desired to mount on the circuit board 10. For example, if the semiconductor chip 20 is a six millimeter square device, then the area 2 may be an approximately fifteen millimeter square area. However, it should be noted that the chip 20 and the corresponding area 2 of the printed circuit board 10 may be selected to be virtually any practical size.

Each of the circuit lines 11 is made of copper or other such suitable conductive material, and is sized to accommodate the semiconductor chip 20 which is connected to the circuit lines 11. For example, if the semiconductor chip 20 is a six millimeter square device as described above then each of the circuit lines 11 may have a width of approximately 7.6 to 12.7 microns (about 0.0003 to 0.0005 inch) and a height of approximately 12.7 to 35.6 microns (about 0.0005 to 0.0014 inch), with a spacing between the circuit lines 11 of approximately 25.4 to 152.4 microns (about 0.001 to 0.006 inch).

The terminus 16 of each of the circuit lines 11 "floats" on the surface of the printed circuit board 10, and includes a stress relief bend 17, for relieving stresses, especially thermal stresses, which may affect the physical and electrical connection of the semiconductor chip 20 to the circuit lies 11 on the printed circuit board 10. The term "float" as used herein means that in the area 2 of the printed circuit board 10, the terminus 16 of each of the circuit lines 11 does not adhere sufficiently to the underlying surface of the circuit board 10 to fix the terminus 16 in place, but does adhere sufficiently to the underlying surface of the circuit board 10 to prevent gross movements of the terminus 16. Thus, the terminus 16 of each of the circuit lines 11 may move (float) on the surface of the circuit board 10 to relieve stress, without adversely affecting the overall electrical and physical characteristics of the circuit lines 11.

In contrast to the relatively low adhesion area 2 of the printed circuit board 10, in area 4 of the printed circuit board 10 which completely surrounds area 2 of the printed circuit board 10, portion 19 of each of the printed circuit lines 11 does adhere sufficiently to the underlying surface of the printed circuit board 10 to fix the portion 19 of each of the circuit lines 11 in place on the circuit board 10. For example, the terminus 16 of each of the circuit lines 11 may adhere to the underlying circuit board 10 in the area 2 with a force of less than approximately 0.35 newton per linear millimeter (about two pounds per linear inch), while the portion 19 of each of the circuit lines 11 may adhere to the underlying circuit board 10 in the area 4 with a force of at least approximately 0.88 newton per linear millimeter (about five pounds per linear inch). This difference in adhesion between the terminus 16, and the portion 19, of each of the circuit lines 11, to the area 2 and the area 4, respectively, of the printed circuit board 10, is an important aspect of providing a relatively simple stress relieving electrical connection according to the principles of the present invention.

As depicted in FIG. 1, preferably, the stress relief bend 17 of each of the circuit lines 11 is generally "U" shaped with the "U" having a height (A) of approximately two to three times the width (B) of the circuit line 11, and a width (C) of approximately four to six times the width (B) of the circuit line 11. For example, if the each of the circuit lines 11 has a width (B) of approximately 7.6 microns (0.0003 inch) then, preferably, the stress relief bend 17 is generally "U" shaped with the "U" having a height (A) of approximately 15.2 to 22.8 microns (about 0.0006 to 0.0009 inch) and a width (C) of approximately 30.4 to 45.6 microns (about 0.0012 to 0.0018 inch). However, it should be noted that the stress relief bend 17 of the terminus 16 of each of the circuit lines 11 may have any one of a number of sizes and configurations capable of relieving the undesired stresses, and, if desired for certain applications, each stress relief bend 17 may have a different size and configuration, as long as the sizes and configurations of the stress relief bends 17 are designed to provide a suitable overall pattern for the circuit lines 11. An especially desirable configuration for the stress relief bends 17 to maintain a desired circuit line density is a nested configuration with each of the adjacent circuit lines 11 running generally parallel to each other with adjacent stress relief bends 17 having a relatively low profile (that is, relatively unpronounced generally "U"-shaped curvature) and nested together.

Figure 2:
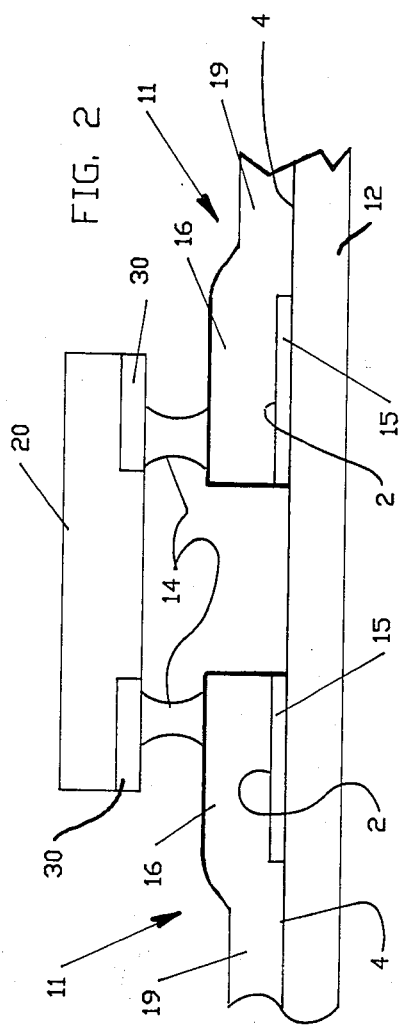
FIG. 2 is a cross sectional view, taken along line I—I, of the printed circuit board with semiconductor chip mounted thereon, shown in FIG. 1.

FIG. 2 is a cross sectional view of the printed circuit board 10 with the semiconductor chip 20 mounted thereon taken along line I—I of FIG. 1. As shown in FIG. 2, the semiconductor chip 20 has electrical terminals (leads) 30 which are physically and electrically connected by solder columns 14 to the termini 16 of the circuit lines 11. For example, each of these connections between the terminals 30 of the semiconductor chip 20 and the termini 16 of the circuit lines 11 may be a controlled collapse chip connection (C-4). However, if desired, the electrical terminals 30 of the semiconductor chip 10 may be connected to the termini 16 of the circuit lines 11 by wire bonding or by any other suitable technique.

Also, as shown in FIG. 2, the printed circuit board 10 comprises a substrate 12 having a surface area 2 (also see FIG. 1) to which the terminus 16 of each of the circuit lines 11 does not adhere sufficiently to fix the terminus 16 in place, and thus the terminus floats on this area 2 of the substrate 12 to provide stress relief as discussed previously. In area 4 of the circuit board 10 (also see FIG. 1), the portions 19 of the circuit lines 11 adhere sufficiently to the underlying substrate 12 to fix the circuit lines 11 in position on the circuit board 10.

Preferably, the substrate 12 of the printed circuit board 10 comprises primarily an organic material, such as glass cloth impregnated with epoxy resin (prepreg) or other such material. However, if desired, the substrate 12 may be made primarily of polyimide, a polyimide/glass composition, or any other such suitable circuit board material.

Also, although FIGS. 1 and 2 show a semiconductor chip 20, preferably made primarily of silicon, mounted on the printed circuit board 10, other suitable electronic devices may be mounted on the circuit board 10 in accordance with the principles of the present invention.

For example, a resistor or capacitor having suitable electrical terminals may be mounted on the circuit board 10, or a ceramic module housing a semiconductor chip may be directly mounted on the printed circuit board 10, according to the principles of the present invention.

In operation, after the semiconductor chip 20, or other such suitable electronic device, is mounted on the printed circuit board 10 by connecting the terminals 30 of the chip 20 to the terminus 16 of the circuit lines 11 in the relatively low adhesive area 2, undesired stresses at these connections between the terminals 30 and the terminus 16 are relieved because each terminus 16 is floating on the surface of the circuit board 10 and because each terminus has a stress relief bend 17. Thus, undesired stresses, caused by temperature changes, mechanical flexing, and/or other such stress producing phenomena, are relieved, for example, during manufacture and operation of the printed circuit board 10. This stress relief helps to prevent the chip 20 from mechanically and/or electrically separating from the circuit lines 11 on the printed circuit board 10 thereby improving the reliability of the circuit board 10.

Figure 3:
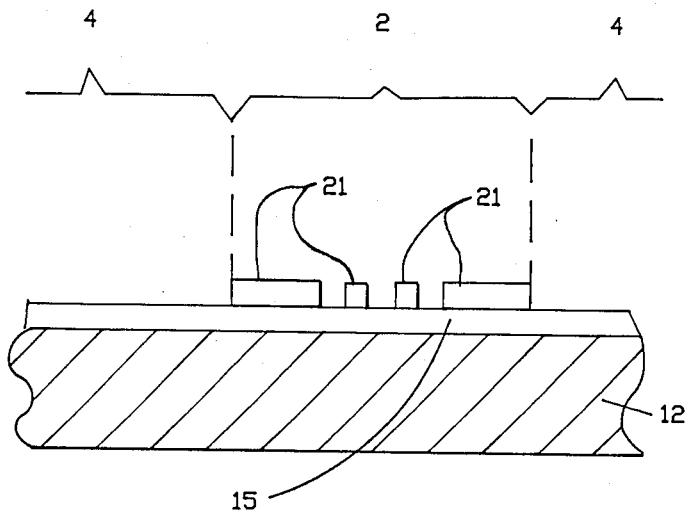
FIGS. 3 and 4 are cross sectional views, taken along the line II—II of FIG. 1, schematically illustrating certain steps in a preferred method of making a flexible electrical connection in accordance with the principles of the present invention.
Figure 4:
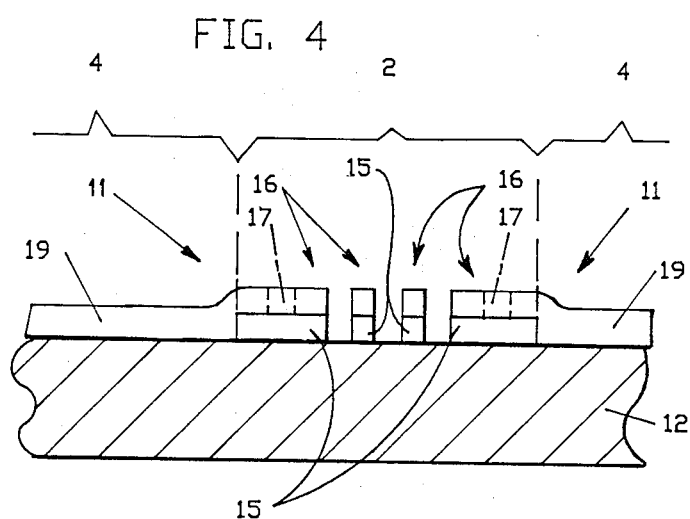

Preferably, according to the present invention, the flexible electrical connection described above is made as described below referring to FIGS. 3 and 4 of the drawing. FIGS. 3 and 4 are cross sectional views, each taken along the line II—II of FIG. 1, schematically illustrating certain steps in this preferred method for making a flexible electrical connection in accordance with the principles of the present invention.

First, referring to FIG. 3, a relatively thin layer of material 15, such as copper, is placed on the relatively thick substrate 12, which, as discussed previously, is preferably made of an organic material(s). A typical substrate 12 may be a structure in the shape of a rectangular board having a thickness of approximately 1,026 to 1,538 microns (0.040 to 0.060 inch), which is made by laminating together several layers of glass cloth impregnated with epoxy resin. The layer of material 15 may be, for example, an approximately 5.1 microns (about 0.0002 inch) thick layer of copper. Such a copper layer 15 may be placed on such an organic substrate 12 using any suitable process. For example, a sheet of "peel apart copper" on a suitable carrier (such as copper), with a release layer between the peel apart copper and the carrier, may be brought into contact with the surface of the substrate 12. Then, the carrier and the release layer may be removed from the sheet of peel apart copper which adheres to the underlying organic substrate 12 and remains in place as the copper layer 15 on the organic substrate 12. Such a "peel apart copper" product is commercially available from Yates, Inc. having a place of business in Bordentown, New Jersey.

Still referring to FIG. 3, after the copper layer 15 is in place on the organic substrate 12, a layer of photoresist material 21, such as type 3515 photoresist which is commercially available from E.I. Du Pont de Nemours and Company having a place of business in Wilmington, Delaware, is applied over the copper layer 15. Then the photoresist material 21 is exposed and developed using conventional photoresist processing techniques to form an image of just the terminus 16 with the stress relief bend 17 of each of the circuit lines 11 which it is desired to construct on the copper layer 15 in the relatively low adhesion area 2 of the substrate 12 of the circuit board 10. FIG. 3 shows in cross section the organic substrate 12 having the copper layer 15 thereon with the photoresist material 21 exposed and developed to form the desired image in the relatively low adhesion area 2.

Referring to FIGS. 3 and 4, after the desired image of the terminus 16 with the stress relief bend 17 of each of the circuit lines 11 is formed by the exposed and developed photoresist material 21 on the copper layer 15 in the relatively low adhesion area 2, the portions of the copper layer 15 not covered by the photoresist material 21 are removed, for example, by using any suitable conventional copper etching process, to leave the copper layer 15 only in those areas protected by the photoresist material 21. Then, the photoresist material 21 is removed, for example, by using a suitable conventional photoresist stripping process.

After removing the photoresist material 21 as described above, a cationic surfactant, such as Reten 210 which is commercially available from Hercules Powder Company having a place of business in Wilmington, Delaware, is applied to the entire surface of the substrate 12, including the area 2 of the substrate 12 having the copper layer 15 with the pattern of the terminus 16 and the stress relief bend 17 of each of the circuit lines 11 which it is desired to form on the substrate 12. This application of the cationic surfactant is followed by a seeding of the entire surface of the substrate 12 with a colloidal tin/palladium seed layer, for example, such as described in U.S. Pat. No. 4,448,804 which is assigned to International Business Machines (IBM) Corporation and which is incorporated herein by reference. Then, another (second) layer of photoresist (not shown), such as Riston type T168 photoresist which is commercially available from E. I. Du Pont de Nemours and Company having a place of business in Wilmington, Delaware, is applied over the entire surface of the substrate 12. This second layer of photoresist material is exposed and developed using conventional photoresist processing techniques to form a negative image of the entire circuit line pattern which it is desired to construct on the substrate 12. More specifically, this second layer of photoresist material is exposed and developed to form a negative image corresponding to all of the circuit lines 11 which it is desired to form on the substrate 12 of the circuit board 10, including the termini 16 having the stress relief bends 17 in the area 2, and the portions 19 in the area, of the circuit lines 11.

After this desired negative image of the entire circuit line pattern is formed on the substrate 12 by the exposed and developed second layer of photoresist material, the circuit lines 11 are formed by depositing a conductive material, preferably copper, onto the areas of the substrate 12 not covered by the photoresist, including those areas of the substrate 12 with the copper layer 15 which was left on the substrate 12 after the first photoresist process described above and which is patterned with the configuration of the terminus 16 with the stress relief bend 17 of each of the circuit lines 11. The conductive material may be deposited on the substrate 12 in any suitable manner to form the circuit lines 11. For example, copper may be deposited on the substrate 12 to form the circuit lines 11 by using a conventional additive copper plating process. The photoresist forming the negative image of the desired circuit lines 11 is then removed, for example, by using a suitable conventional photoresist stripping process to leave the structure shown in FIG. 4.

As best shown in FIG. 1, the foregoing method results in each of the circuit lines 11 having a terminus 16 with a stress relief bend 17 floating on a relatively low adhesion area 2 of the substrate 12 of the circuit board 10, and having a portion 19 fixed on a relatively high adhesion area 4 of the substrate 12 of the circuit board 10. The terminus 16 with the stress relief bend 17 of each of the circuit lines 11 floats on the area 2 of the substrate 12 of the circuit board 10 due to the above described treatment of the underlying copper layer 15 with the cationic surfactant. This treatment dramatically decreases the adhesion of the terminus 16 with the stress relief bend 17 of each of the circuit lines 11 to the underlying copper layer 15 on the substrate 12 of the circuit board 10, relative to the adhesion which would otherwise occur. For example, this treatment reduces copper to copper adhesion from approximately 2.64 newtons per linear millimeter (about fifteen pounds per linear inch) to approximately 0.18 to 0.35 newtons per linear millimeter (about one to two pounds per linear inch). In contrast, this treatment dramatically increases the adhesion of the portion 19 of each of the circuit lines 11 to the substrate 12 of the circuit board 10 in the area 4 since the copper layer 15 is not present in this area 4 and the cationic surfactant followed by the seeding with the colloidal tin/palladium acts to increase the adhesion in this area 4, relative to the adhesion which would otherwise occur. For example, this treatment increases copper to glass cloth/epoxy resin adhesion from approximately 0.35 to 0.53 newtons per linear millimeter (about two to three pounds per linear inch) to approximately 0.70 to 0.88 newtons per linear millimeter (about four to five pounds per linear inch).

Thus, the foregoing preferred method according to the present invention results in each of the circuit lines 11 having a terminus 16 with a stress relief bend 17 floating on a relatively low adhesion area 2 of the substrate 12 of the circuit board 10 to provide a relatively simple stress relieving electrical connection which may be used for mounting an electronic device directly on the circuit board 10, as described previously. Of course, there are other ways of making the relatively low adhesive area 2 on the substrate 12 of the circuit board 10. For example, the foregoing method may be followed except that, prior to applying the first photoresist material 21, the entire copper layer 15 placed on the substrate 12 is etched away from the substrate 12 and the photoresist material 21 is applied, exposed and developed to protect only the area 4 and to not cover any of the area 2 of the circuit board 10. Then, the open area 2 is treated with concentrated sulfuric acid, or vapor blasted, after which the remaining steps of the foregoing method are followed. The sulfuric acid or vapor blast treatment of the open area 2 results in reducing the adhesion of the circuit lines 11 to this area 2 of the substrate 12 of the circuit board 10, relative to the adhesion which would otherwise occur. Alternatively, the foregoing method may be followed except that the copper layer 15 is selectively pretreated with sulfuric acid, vapor blast or etching, prior to bringing the copper layer 15 into contact with the surface of the substrate 12 and laminating the copper layer 15 to the substrate 12 with the selectively pretreated side of the copper layer 15 facing the surface of the substrate 12. This selective pretreatment will generate smooth areas on the copper layer 15 which, upon lamination and subsequent complete removal of the copper 15, will cause smooth areas to form on the surface of the substrate 12 which replicate the smooth areas on the copper layer 15 which are selected to have the pattern of the terminus 16 of each of circuit lines 11 which it is desired to form on the relatively low adhesion area 2 of the substrate 12 of the circuit board 10. This selective smoothing in the area 2 of the circuit board 10 reduces the adhesion of the circuit lines 11 to this area 2 of the substrate 12 of the circuit board 10, relative to the adhesion which would otherwise occur.

Of course, the foregoing description is directed to one particular embodiment of the present invention and various modifications and other embodiments of the present invention will be apparent to one of ordinary skill in the art to which the present invention pertains. Therefore, while the present invention has been described in conjunction with a particular embodiment it is to be understood that various modifications and other embodiments of the present invention may be made without departing from the scope of the present invention as described herein and as claimed in the appended claims.

What is claimed is:

1. A flexible electrical connection for mounting an electronic device made primarily of silicon on a circuitized substrate made primarily of an organic material, comprising:
    a plurality of adjacent circuit lines each having a terminus floating on a relatively low adhesive area of the circuitized substrate, each terminus having a generally "U" shaped stress relief bend nested within the generally "U" shaped stress relief bend of the circuit line adjacent to it, and each circuit line having a portion, extending from its terminus, which is fixed to a relatively high adhesive area of the circuitized substrate.

2. A flexible electrical connection as recited in claim 1 wherein said stress relief bend is generally "U" shaped, with the "U" having a height of approximately two to three times the width of said circuit line, and a width of approximately four to six times the width of said circuit line.

* * * * *